US011817883B2

(12) United States Patent
Avraham et al.

(10) Patent No.: US 11,817,883 B2
(45) Date of Patent: Nov. 14, 2023

(54) VARIABLE LENGTH ECC CODE ACCORDING TO VALUE LENGTH IN NVME KEY VALUE PAIR DEVICES

(71) Applicant: Western Digital Technologies, Inc., San Jose, CA (US)

(72) Inventors: David Avraham, Even Yehuda (IL); Ran Zamir, Ramat Gan (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 52 days.

(21) Appl. No.: 17/562,105

(22) Filed: Dec. 27, 2021

(65) Prior Publication Data

US 2023/0208448 A1   Jun. 29, 2023

(51) Int. Cl.
*H03M 13/00*  (2006.01)
*G06F 11/10*  (2006.01)

(52) U.S. Cl.
CPC ..... *H03M 13/6577* (2013.01); *G06F 11/1068* (2013.01)

(58) Field of Classification Search
CPC ........................ H03M 13/6577; G06F 11/1068
See application file for complete search history.

(56) References Cited

U.S. PATENT DOCUMENTS

| 7,882,300 B2 | 2/2011 | Kim et al. |
| 8,327,226 B2 | 12/2012 | Rub |
| 8,418,021 B2 | 4/2013 | Lin et al. |
| 8,650,458 B2 | 2/2014 | Kim et al. |
| 9,075,710 B2 | 7/2015 | Talagala et al. |
| 9,214,963 B1* | 12/2015 | Garani ................ G06F 11/1048 |
| 9,317,362 B2 | 4/2016 | Khan |
| 9,619,381 B2 | 4/2017 | Camp et al. |
| 9,654,141 B2 | 5/2017 | Radke |
| 9,959,067 B2 | 5/2018 | Yang et al. |
| 10,073,732 B2 | 9/2018 | Lee et al. |
| 10,284,231 B2 | 5/2019 | Canepa |
| 10,693,501 B2* | 6/2020 | Park ................. H03M 13/2707 |
| 10,735,031 B2 | 8/2020 | Avraham et al. |
| 10,770,168 B2 | 9/2020 | Cadloni et al. |

(Continued)

FOREIGN PATENT DOCUMENTS

WO   20210162734 A1   8/2021

OTHER PUBLICATIONS

International Search Report and Written Opinion for International Application No. PCT/US2022/029509 dated Sep. 23, 2022.

(Continued)

*Primary Examiner* — Guy J Lamarre
(74) *Attorney, Agent, or Firm* — PATTERSON + SHERIDAN, LLP; Steven H. VerSteeg

(57) ABSTRACT

A data storage device includes a memory device and a controller coupled to the memory device. The controller is configured to determine an error correction code (ECC) code length for KV pair data and/or an ECC code rate for the KV pair data, where the ECC code length and the ECC code rate are selected according to a value length and decoding capability of the KV pair data, generate ECC parity based on the selecting, and program the KV pair data and the generated ECC parity to the memory device.

20 Claims, 8 Drawing Sheets

(56) References Cited

U.S. PATENT DOCUMENTS

| | | |
|---|---|---|
| 10,795,760 B2 | 10/2020 | Ki |
| 2003/0043749 A1* | 3/2003 | Tanaka .................... H04L 1/007 714/799 |
| 2007/0271493 A1* | 11/2007 | Oh .......................... H04L 1/007 714/755 |
| 2013/0024746 A1* | 1/2013 | Sharon ................ G06F 11/1044 714/766 |
| 2013/0086224 A1* | 4/2013 | Teraguchi ........... G06F 11/0748 709/219 |
| 2013/0250686 A1 | 9/2013 | Marukame et al. |
| 2014/0136927 A1 | 5/2014 | Li et al. |
| 2014/0153654 A1* | 6/2014 | Vojcic ................ H04N 21/4382 375/240.28 |
| 2015/0003169 A1 | 1/2015 | Nam et al. |
| 2016/0041783 A1 | 2/2016 | Choi et al. |
| 2016/0342467 A1* | 11/2016 | Kumar .................... G11C 29/52 |
| 2018/0358989 A1 | 12/2018 | Mehra et al. |
| 2019/0258543 A1 | 8/2019 | Park |
| 2020/0007158 A1 | 1/2020 | Cooper et al. |
| 2020/0127685 A1* | 4/2020 | Chen ....................... G11C 29/52 |
| 2020/0225882 A1 | 7/2020 | Li |
| 2020/0226065 A1 | 7/2020 | Yang et al. |
| 2020/0235757 A1 | 7/2020 | Achtenberg et al. |
| 2020/0301850 A1 | 9/2020 | Qiu et al. |
| 2020/0301899 A1 | 9/2020 | Tu et al. |
| 2021/0055886 A1 | 2/2021 | Twitto et al. |
| 2021/0089391 A1 | 3/2021 | Kuribara |
| 2021/0157746 A1 | 5/2021 | Lee et al. |
| 2021/0191882 A1 | 6/2021 | Lee et al. |
| 2021/0218421 A1 | 7/2021 | Fainzilber et al. |
| 2022/0147440 A1* | 5/2022 | Benisty ............... G06F 12/0868 |

OTHER PUBLICATIONS

International Search Report and Written Opinion for International Application No. PCT/US2022/029547 dated Oct. 11, 2022.

International Search Report and Written Opinion for International Application No. PCT/US2022/029546 dated Oct. 21, 2022.

Pitchumani, et al., Hybrid Data Reliability for Emerging Key-Value Storage Devices, USENIX Association, 18th USENIX Conference on File and Storage Technologies, Feb. 2020, 15 pp.

Chen, et al., KVFTL: Optimization of Storage Space Utilization for Key-Value-Specific Flash Storage Devices, 2017 22nd Asia and South Pacific Design Automation Conference (ASP-DAC), 7 pp.

Kim, et al., The Key to Value: Understanding the NVMe Key-Value Standard, Live Website, Sep. 1, 2020, SNIA NSF, Networking Storage, 31 pp.

Martin, et al, NVM Express Technical Proposal for New Feature, Jun. 2020, NVM Express, Inc., 34 pp.

Adams, NVMe@Base Specification 2.0 Preview, Flash Memory Summit, 2020, NVM Express organization, 20 pp.

Samsung Key Value SSD Enables High Performance Scaling, A Technology Brief by Samsung Memory Solutions Lab, Samsung Electronics, Co. Ltd., 2017, 8 pp.

\* cited by examiner

US 11,817,883 B2

VARIABLE LENGTH ECC CODE ACCORDING TO VALUE LENGTH IN NVME KEY VALUE PAIR DEVICES

BACKGROUND OF THE DISCLOSURE

Field of the Disclosure

Embodiments of the present disclosure generally relate to data storage devices, such as solid state drives (SSDs), and, more specifically, storing key value (KV) pair data in a data storage device.

Description of the Related Art

A KV database works by storing a quantity of user data that is associated with a key that is addressable as a complete entity. Examples of user data that can be stored in a KV database may include photos, records, and files. From a host device point-of-view, the photo, the record, or the file may be retrieved using a single key/address, rather than using multiple addresses that include data of the photo, the record, or the file. The data is stored as unstructured data and may be addressed using a key of variable length. Storage space of a memory device may be allocated for KV pair data in increments of bytes, where a length value of the KV pair data is associated with the necessary storage space to store the KV pair data.

Using a KV database in a data storage device may increase the performance of the data storage device. For example, the number of data transfers/second may be improved because the KV pair data to physical storage location translation layer in the host device may be removed. Furthermore, the number of commands over the bus may be reduced since an entire KV pair data may utilize a single transfer. KV pair data allows access to data on a controller using a key rather than a block address. By providing a key to store a corresponding value on a memory device, the value may be retrieved from the memory device using the corresponding key. Error correction codes (ECC) have variable lengths that may depend on a life cycle of the memory device or a bit error rate (BER) level of the memory device. Because programming ECC data to the memory device requires storage space, the overall storage space of the memory device for storing non-ECC data may be decreased.

Therefore, there is a need in the art for optimizing ECC lengths for KV pair data.

SUMMARY OF THE DISCLOSURE

The present disclosure generally relates to data storage devices, such as solid state drives (SSDs), and, more specifically, storing key value (KV) pair data in a data storage device. A data storage device includes a memory device and a controller coupled to the memory device. The controller is configured to determine an error correction code (ECC) code length for KV pair data and/or an ECC code rate for the KV pair data, where the ECC code length and the ECC code rate are selected according to a value length and decoding capability of the KV pair data, generate ECC parity based on the selecting, and program the KV pair data and the generated ECC parity to the memory device.

In one embodiment, a data storage device includes a memory device and a controller coupled to the memory device. The controller is configured to determine an error correction code (ECC) code length for KV pair data and/or an ECC code rate for the KV pair data, where the ECC code length and the ECC code rate are selected according to a value length and decoding capability of the KV pair data, generate ECC parity based on the selecting, and program the KV pair data and the generated ECC parity to the memory device.

In another embodiment, a data storage device includes a memory device and a controller coupled to the memory device. The controller is configured to determine an error correction code (ECC) code length for KV pair data and/or an ECC code rate for the KV pair data, where the ECC code length and the ECC code rate are selected according to a value length and a relative performance (RP) of the KV pair data, generate ECC parity based on the selecting, and program the KV pair data and the generated ECC parity to the memory device.

In another embodiment, a data storage device includes memory means and a controller coupled to the memory means. The controller is configured to select an error correction code (ECC) rate and/or an ECC length based on one or more of a value length, a relative performance (RP), and a decoding capability of a key value (KV) pair data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, storing key value (KV) pair data in a data storage device. A data storage device includes a memory device and a controller coupled to the memory device. The controller is configured to determine an error correction code (ECC) code length for KV pair data and/or an ECC code rate for the KV pair data, where the ECC code length and the ECC code rate are selected according to a value length and decoding capability of the KV pair data, generate ECC parity based on the selecting, and program the KV pair data and the generated ECC parity to the memory device.

Figure 1:
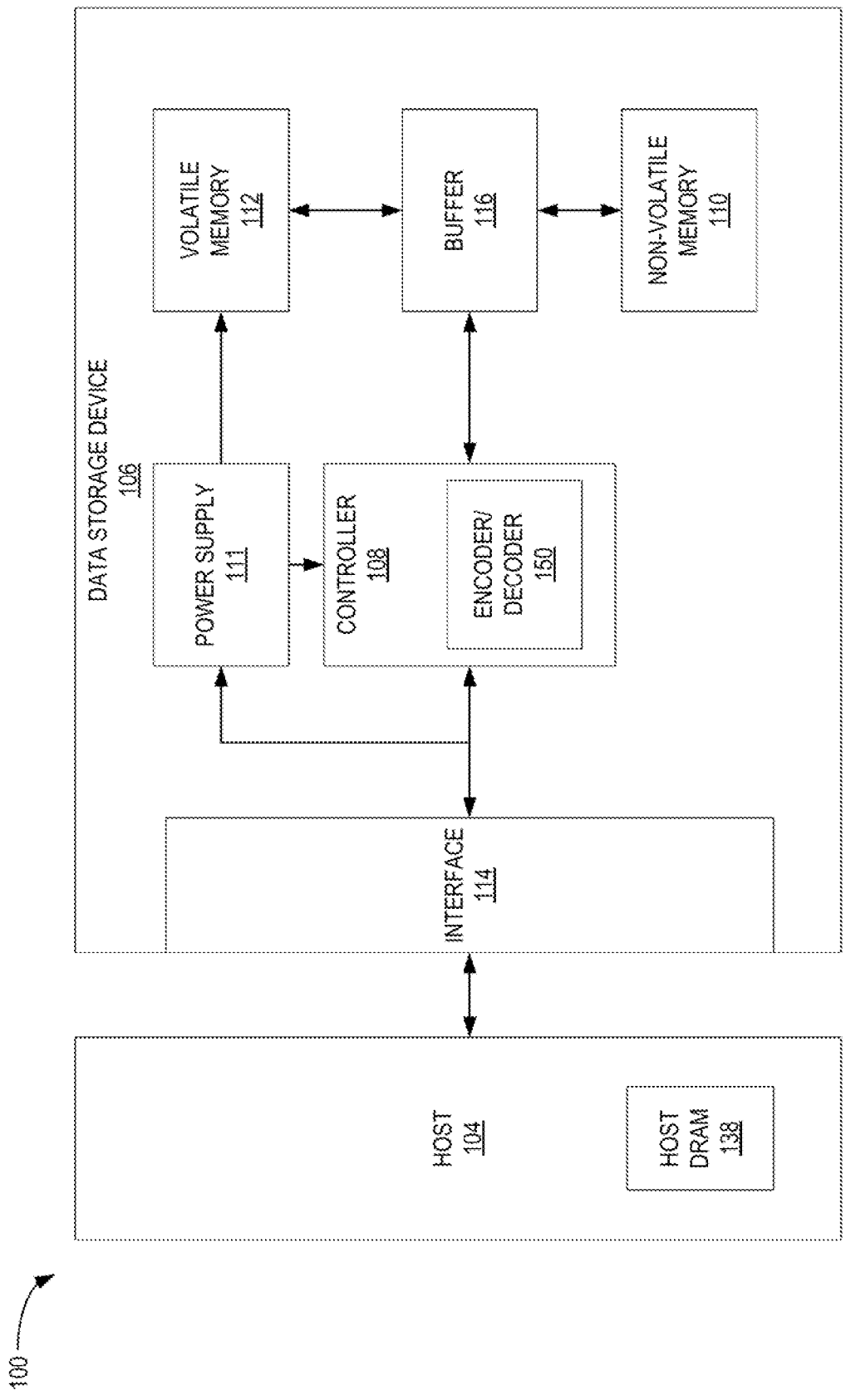
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The controller 108 includes an encoder/decoder unit 150. The encoder/decoder unit 150 may be separate components, such that the controller 108 includes an encoder unit and a decoder unit. Furthermore, the encoder/decoder unit 150 may be coupled to the controller 108, where the encoder/decoder unit 150 is external to the controller 108. The encoder of the encoder/decoder unit 150 may be configured to encode received host data with error correction code (ECC) in order to protect the received host data from bit errors and/or to correct bit errors. The decoder of the encoder/decoder unit 150 may be configured to determine if the host data read from the NVM 110 includes bit errors and correct bit errors. The decoder decodes the host data read from the NVM 110 so that the host device 104 may be able to read the data. In some embodiments, the decoder is a content aware decoder or an iterative content aware decoder.

KV pair data stores host data, which corresponds to objects in a higher data hierarchy, such that the KV pair data may have inherent structures (e.g., journaling, data tables, padded areas. etc.). Because bits in data may be statistically dependent on another bit, content aware decoders may use pattern recognition to improve decoding performance. For example, in a text file, bits are organized in bytes, where each byte represents a character. The most used characters in the text file may be alphanumeric, spaces, and/or punctuation marks. Therefore, bits from the same byte may be statistically dependent. By knowing at least a portion of the bits within a byte, the decoding performance of the content aware decoder may be increased due to the recognition of the statistics of the byte.

KV pair data includes a key and a value, where the data of the value is addressed by the key. The key may have a size of about 1 byte to about 64 bytes and the value may have a size of about 0 bytes to about $2^{32}-1$ bytes. For example, a value having a size of about 0 bytes is an empty value. It is to be understood that the previously mentioned values are not intended to be limiting, but to provide an example of an embodiment. A KV system may include a command set that includes, in a non-limiting list, a delete command, a list command, a retrieve command, an exist command, and a store command.

The delete command may cause the controller 108 to delete the key and value associated with a specified key. The list command may cause the controller 108 to list keys that exist in a KV namespace starting at a specified key. The exist command may cause the controller 108 to return a status indicating whether a KV exists for a specified key to the command generator, such as the host device 104. The store command may cause the controller 108 to store a KV to a KV namespace.

The retrieve command may cause the controller 108 to retrieve the value associated with a specified key from a KV namespace. The length to be retrieved of the KV pair data is specified in the retrieve command and the location to transfer the KV pair data is specified by either a scatter gather list (SGL) pointer or a physical region page (PRP) pointer in the retrieve command. If the specified length in the retrieve command is less than the length of the KV pair data that is being retrieved, then the controller 108 returns the requested amount and the length of the KV pair data to the completion queue. However, if the specified length in the retrieve command is greater than the length of the KV pair data that is being retrieved, then the controller 108 returns the data from the NVM 110 and the length of that KV pair data is returned to the completion queue.

In the KV system, there may be one or more KV formats present, each with a different set of KV sizes and properties. Furthermore, each KV format may have a relative performance (RP) requirement which may dictate where the KV pair data is stored in the NVM 110. It is to be understood that the term "requirement" may refer to a general guideline, such that the controller 108 may attempt to program KV pair data in the RP specified wordlines or blocks, but may also program the KV pair data in adjacent RP groups to the RP requirement. Blocks of the NVM 110 may be classified according to conditions that relate to the health of the block. For example, conditions relating to the health of the block may include, but not limited to, a number of program erase cycles (PEC), a bit error rate (BER) severity, a physical location of a wordline on the block, and an amount of time exceeding a temperature threshold or thresholds. Wordlines near an edge of the block may exhibit higher BER than wordlines near the middle of the block.

Therefore, blocks and/or wordlines of the blocks may be logically grouped into performance groups. For example, there may be four groups where a first group has the highest performance, a second group has a performance lower than the first group, a third group has a performance lower than the second group, and a fourth group has a performance lower than the third group. An example of RP values is shown in Table 1 below.

TABLE 1

| Value | Definition |
| --- | --- |
| 00b | Best Performance |
| 01b | Better Performance |
| 10b | Good Performance |
| 11b | Degraded Performance |

When storing KV pair data, the value of the KV pair data may be divided between wordlines and blocks of the NVM 110 that have different health properties in order to ensure that overall read throughput is not impaired due to random placement across the blocks. Additionally, prioritization of values may be incorporated. For example, values with a higher RP requirement are placed in blocks that have a first health and values with a lower RP requirement are placed in blocks that have a second health, where the first health is greater than the second health. For example, the first health may be associated with "best performance" or "00b" of Table 1 and the second health may be associated with "better performance" or "01 b" of Table 1 above.

Figure 2:
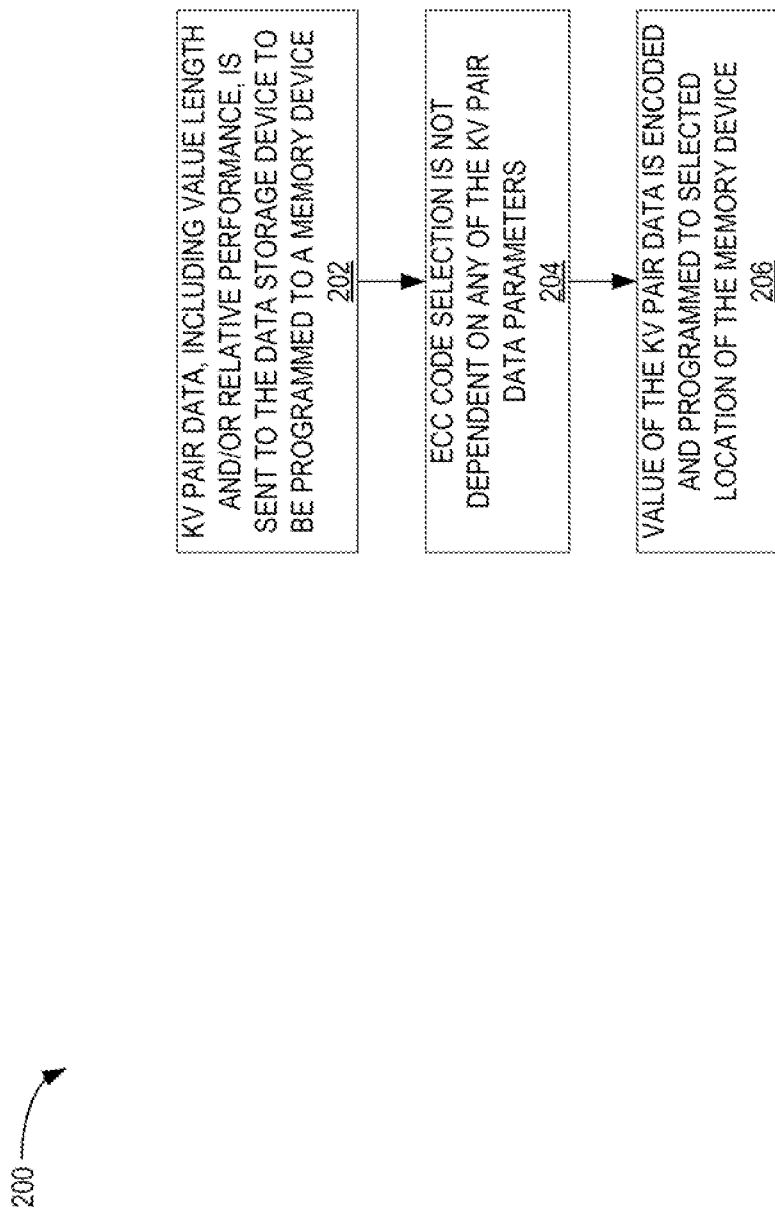
FIG. 2 is a flow diagram illustrating a method of programming encoded KV pair data to a memory device, according to certain embodiments.

FIG. 2 is a flow diagram illustrating a method 200 of programming encoded KV pair data to a memory device, according to certain embodiments. Aspects of the storage system 100 of FIG. 1 may be referenced herein for exemplary purposes. For example, method 200 may be executed by the controller 108. At block 202, the controller 108 receives KV pair data to be programmed to a memory device, such as the NVM 110. The KV pair data includes a value length and/or an RP requirement.

At block 204, the controller 108 selects an ECC code length based on a health of the memory device. The health of the memory device may be based on either a BER level of the memory device (or block to be programmed), a PEC of the memory device (or block to be programmed), a number of operating hours, and the like. The selection of the ECC code length is not based on the KV pair data parameters, but rather the physical storage location itself. At block 206, an encoder of the controller 108, such as the encoder of the encoder/decoder unit 150, generates the ECC parity data based on the ECC code rate selected at block 204 and encodes the KV pair data and the controller 108 programs the encoded value to the selected location in the memory device.

Figure 3:
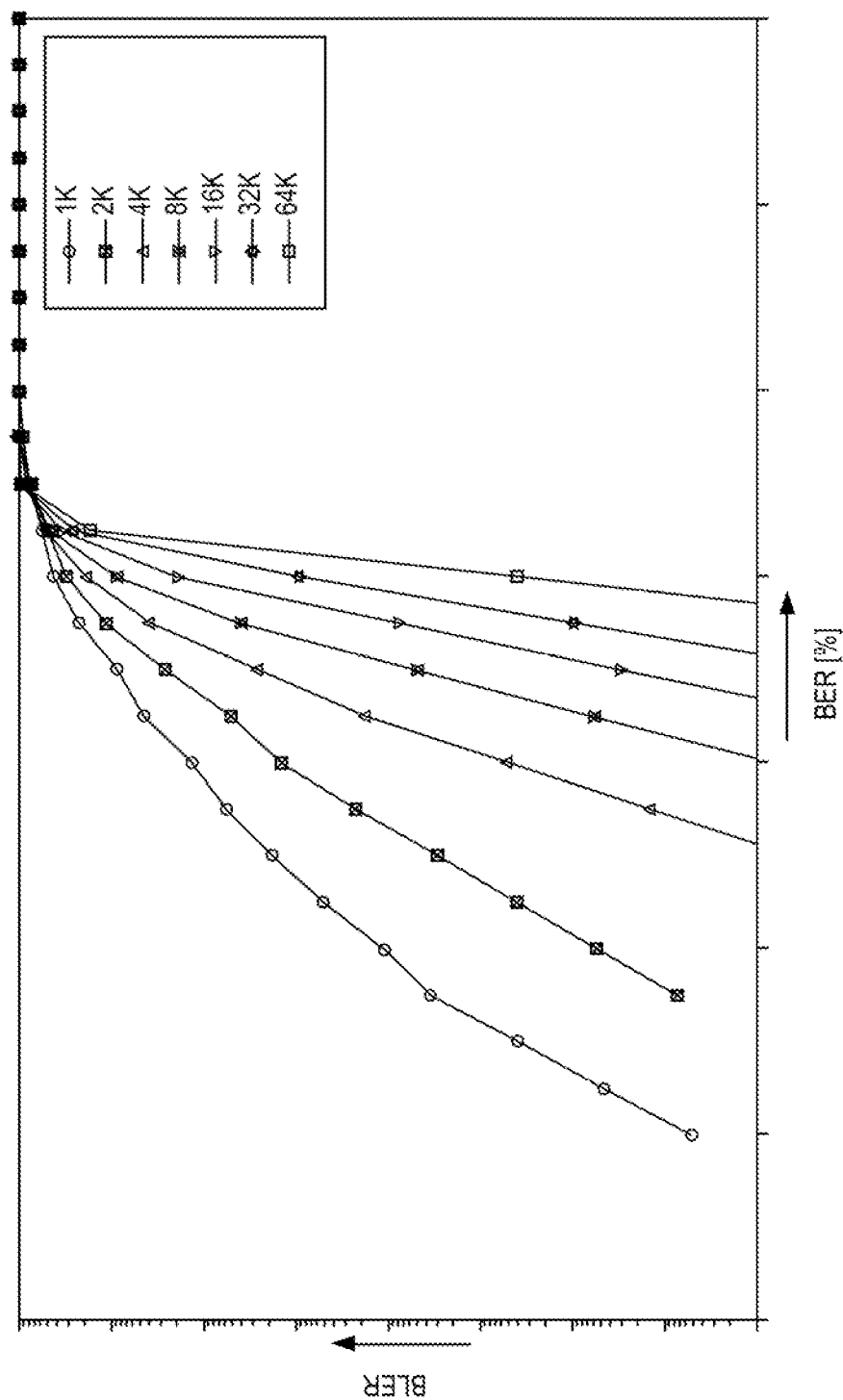
FIG. 3 is an exemplary graph of showing a correction capability of different length ECC data, according to certain embodiments.

FIG. 3 is an exemplary graph 300 of showing a correction capability of different length ECC data, according to certain embodiments. It is to be understood that the values shown are not intended to be limiting, but to provide an example. The upper bound on correction capability or Shannon limit for a given channel may refer to the maximum rate of error-free data that can theoretically be transferred over the channel if the link is subject to random data transmission errors, for a particular noise level. Because ECC data lengths are finite, the Shannon limit for a particular data set may or may not be reached. By using a longer ECC data length, reaching the Shannon limit may be closer than using a shorter ECC data length. In other words, the correction capability increases as the ECC data length increases. For example, in the exemplary graph 300, the 64 KB example has a better correction capability than the 1 K example as indicated by the slope of the curve to reach a block error rate (BLER) of $10^0$.

Figure 4:
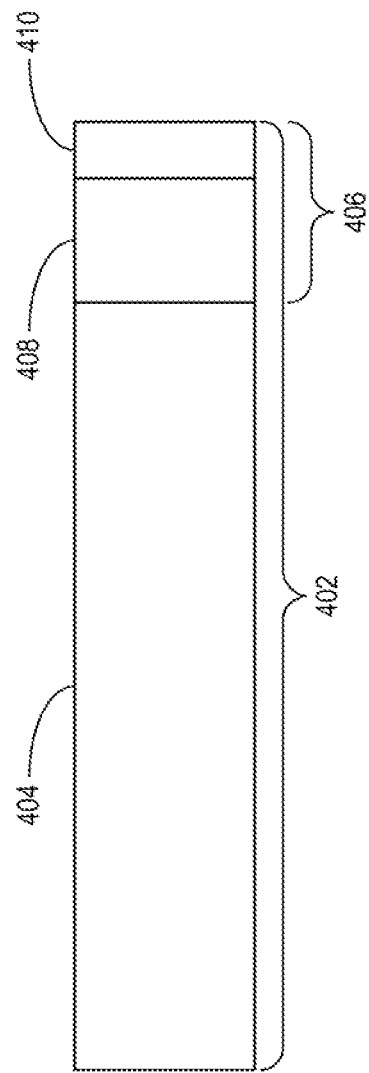
FIG. 4 is an exemplary illustration of a codeword, according to certain embodiments.

FIG. 4 is an exemplary illustration 400 of a codeword 402, according to certain embodiments. Regular address based devices have an unknown length for data being transferred. Thus, for simplicity, an ECC codeword is usually similar to a flash management unit (FMU) size. In cases where the ECC is greater than the length of the FMU, a degraded performance in random read scenarios may arise. For example, in order to read a single FMU, the full codeword may need to be transferred and decoded, thus, adding significant overhead.

However, with a KV pair data, the length of the value is known since the value length is transferred with the key and value. Because the value length is known, an amount of additional parity data (e.g., ECC data) may be adjusted based on the value length. Rather than having a set amount of parity data for data of any size (which may be sized for a worst case scenario), the amount of parity data may be adjusted so that the same or similar correction capability is available for all KV pair data. For example, the codeword 402 includes a host data section 404 and a parity data section 406. Referring to FIG. 3, the correction capability of a 64 KB code length is greater than the correction capability of a 4 KB code length at the same BLER. Thus, if parity data is used in the 64 KB code length, then the correction capability of the 64 KB code length may be similar to the correction capability of the 4 KB code length. Therefore, storage space may be saved by using less parity data for longer code lengths, where the storage space saved may be used for other operations. Thus, the parity section 406 may be reduced by the saved space 410 to an actual parity section 408. The previously mentioned example is not intended to be limiting, but to provide an example. It is contemplated that the amount of saved space may be different in other embodiments.

By decreasing the amount of parity data generated and stored, while maintaining the same quality of service, the saved space may be used for other operations of the data storage device 106. Values may span across multiple wordline and/or blocks, where the values are read sequentially. The saved space may be accumulated by concatenating codewords, where the accumulated saved space may be used for overprovisioning. Thus, the data storage device 106 may be more agile and have improved endurance. In other words, the correction capabilities for KV pair data having different value lengths and/or different KV formats may be the same or similar, where the amount of parity data generated for KV pair data based on value length, RP, and/or correction capability may be less than the amount of parity data generated for KV pair data based on a health of the memory device or the health of the physical storage location.

The saved space may also be used for data shaping, where the additional data may help map the original data into a better representation. For example, the better representation may include coding the data into states that are less stress for the NVM 110 (e.g., shaping the data so that there are more 1 bits than 0 bits). The saved space may also be used for storing firmware metadata, which may allow for increased firmware flexibility.

The data storage device 106 is able to manipulate data based on content, where values may be searched for due to a particular pattern or an encoding performed on the value. The saved space may be used to keep content metadata that is related to the content of the saved data. Thus, the metadata may be used to improve a processing speed or fetching speed of a retrieve command. For example, the process of sifting features of an image object and/or indexing text documents may be may be improved or quicker.

Figure 5:
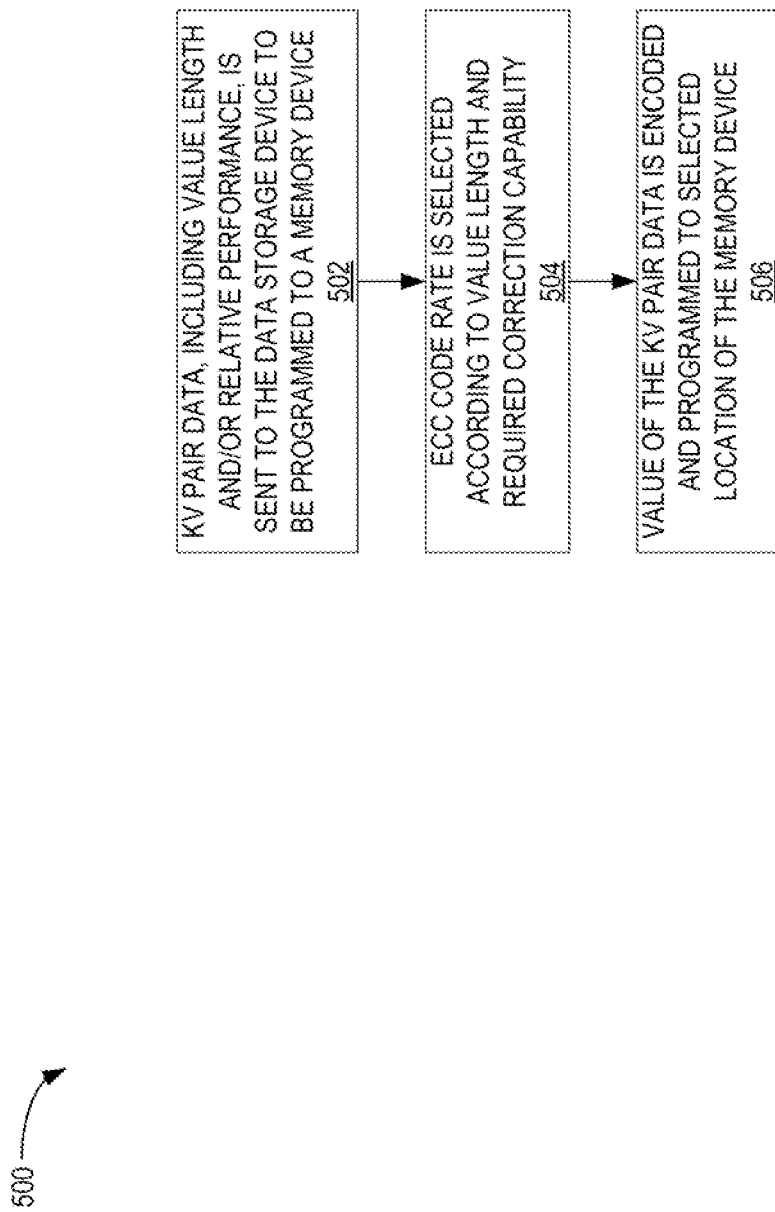
FIG. 5 is a flow diagram illustrating a method of selecting an ECC code rate, according to certain embodiments.

FIG. 5 is a flow diagram illustrating a method 500 of selecting an ECC code rate, according to certain embodiments. Aspects of the storage system 100 of FIG. 1 may be referenced herein for exemplary purposes. For example, method 500 may be executed by the controller 108. At block 502, the controller 108 receives KV pair data to be programmed to a memory device, such as the NVM 110. The KV pair data includes a value length and/or an RP requirement.

At block 504, the controller 108 selects an ECC code rate based on the value length and the required correction capability for the ECC data. The ECC code rate corresponds to a ratio of between the number of data bits and the total number of bits (e.g., data bits plus ECC/parity bits) for a given codeword. For example, a low code rate may correspond to a codeword with a large amount of ECC/parity bits and a high code rate may correspond to a codeword with a low amount of ECC/parity bits. Because the value length of the KV pair data may be variable, the ECC code rate may be adjusted based on the value length and the required correction capability for the value length. At block 506, an encoder of the controller 108, such as the encoder of the encoder/decoder unit 150, generates the ECC parity data based on the ECC code rate selected at block 504 and encodes the KV pair data and the controller 108 programs the encoded value to the selected location in the memory device.

Figure 6:
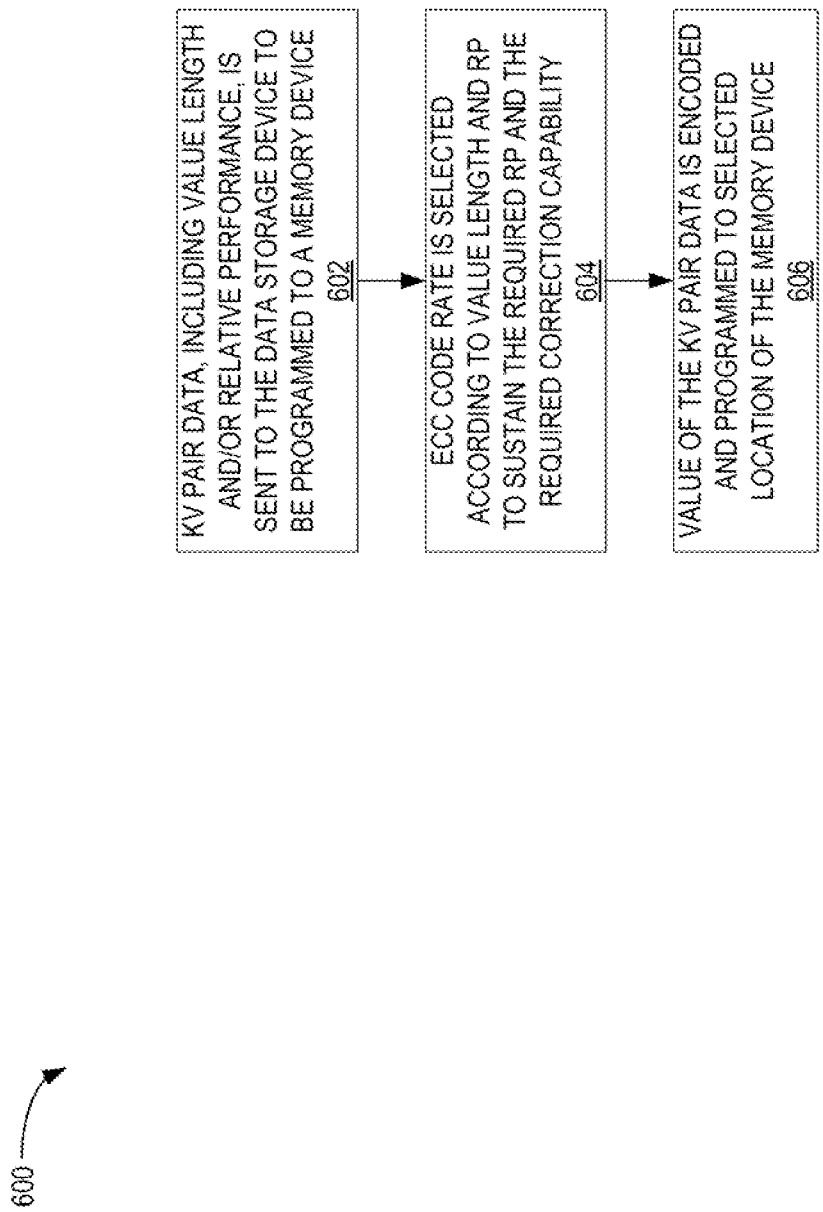
FIG. 6 is a flow diagram illustrating a method of selecting an ECC code rate, according to certain embodiments.

FIG. 6 is a flow diagram illustrating a method 600 of selecting an ECC code rate, according to certain embodiments. Aspects of the storage system 100 of FIG. 1 may be referenced herein for exemplary purposes. For example, method 600 may be executed by the controller 108. At block 602, the controller 108 receives KV pair data to be programmed to a memory device, such as the NVM 110. The KV pair data includes a value length and/or an RP requirement. At block 604, the controller 108 selects an ECC code rate according to the value length and the RP in order to sustain the RP requirement and the required correction capability. At block 606, an encoder of the controller 108, such as the encoder of the encoder/decoder unit 150, generates the ECC parity data based on the ECC code rate selected at block 604 and encodes the KV pair data and the controller 108 programs the encoded value to the selected location in the memory device.

Figure 7:
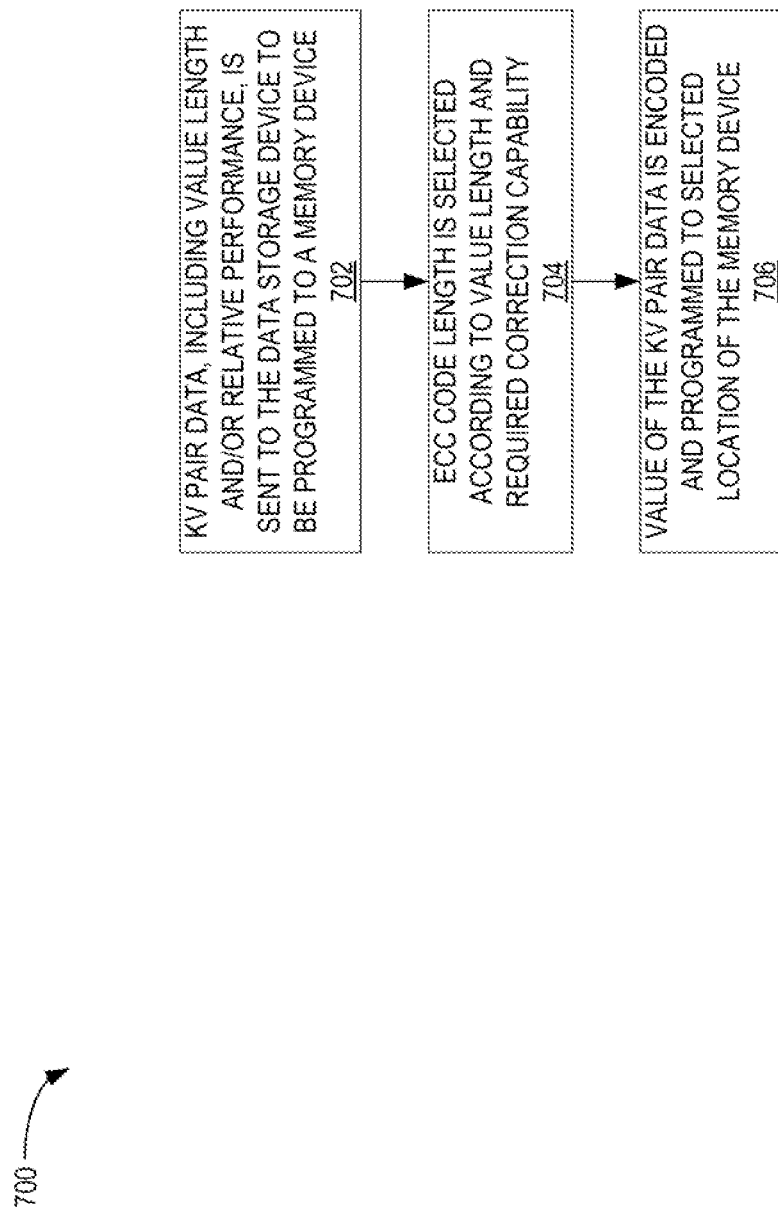
FIG. 7 is a flow diagram illustrating a method of selecting an ECC code length, according to certain embodiments.

FIG. 7 is a flow diagram illustrating a method 700 of selecting an ECC code length, according to certain embodiments. Aspects of the storage system 100 of FIG. 1 may be referenced herein for exemplary purposes. For example, method 700 may be executed by the controller 108. At block 702, the controller 108 receives KV pair data to be programmed to a memory device, such as the NVM 110. The KV pair data includes a value length and/or an RP requirement. At block 704, the controller 108 selects an ECC code length based on the value length and the required correction capability for the ECC data. At block 706, an encoder of the controller 108, such as the encoder of the encoder/decoder unit 150, generates the ECC parity data based on the ECC code rate selected at block 704 and encodes the KV pair data and the controller 108 programs the encoded value to the selected location in the memory device.

Because data is ordered in a KV system and the value length of the value is provided for a given KV format, the data may read sequentially. The ECC code length may be changed according to the KV pair data value length. therefore, when the value length is significantly long, longer ECC code lengths may be used and when the KV value length is short, shorter ECC code lengths may be used. Thus, performance may be improved for various value lengths without impacting other value lengths. Furthermore, the quality of service (QoS) may be improved due to better correction capabilities over various value lengths and a decrease in a probability of decoding failures. In some examples, the decoding latency may be reduced due to more data being decoded by lower tier faster decoder engines.

Figure 8:
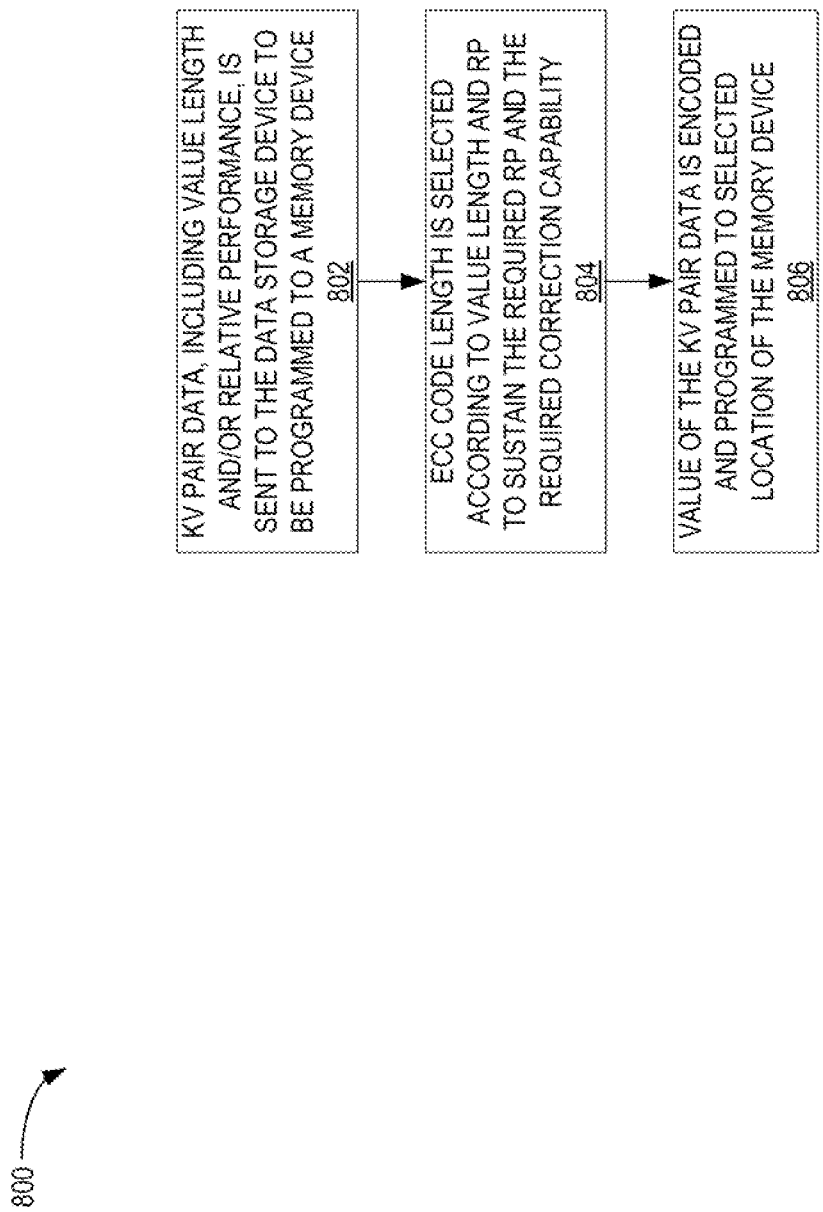
FIG. 8 is a flow diagram illustrating a method of selecting an ECC code length, according to certain embodiments.

FIG. 8 is a flow diagram illustrating a method 800 of selecting an ECC code length, according to certain embodiments. Aspects of the storage system 100 of FIG. 1 may be referenced herein for exemplary purposes. For example, method 800 may be executed by the controller 108. At block 802, the controller 108 receives KV pair data to be programmed to a memory device, such as the NVM 110. The KV pair data includes a value length and/or an RP requirement. At block 804, the controller 108 selects an ECC code length according to the value length and the RP in order to sustain the RP requirement and the required correction capability. At block 806, an encoder of the controller 108, such as the encoder of the encoder/decoder unit 150, generates the ECC parity data based on the ECC code rate selected at block 804 and encodes the KV pair data and the controller 108 programs the encoded value to the selected location in the memory device.

It is to be understood that methods 500, 600, 700, and 800 may be implemented together (e.g., two or more of the methods) or independently.

By changing the amount of parity data generated for KV pair data based on the value length and the RP of the KV pair data, overall system performance may be increased, correction capability may be improved, latency may be decreased, and QoS may be improved.

In one embodiment, a data storage device includes a memory device and a controller coupled to the memory device. The controller is configured to determine an error correction code (ECC) code length for KV pair data and/or an ECC code rate for the KV pair data, where the ECC code length and the ECC code rate are selected according to a value length and decoding capability of the KV pair data, generate ECC parity based on the selecting, and program the KV pair data and the generated ECC parity to the memory device.

All KV pair data has an equal correction capability. The correction capability is independent of the value length of the KV pair data. The controller is further configured to select the ECC code rate based on a relative performance (RP) and the value length. The RP includes a first tier, a second tier, a third tier, and a fourth tier. The first tier has a better performance than the second tier. The second tier has a better performance than the third tier. The third tier has a better performance than the fourth tier. The controller is further configured to receive KV pair data from a host device. The received KV pair data includes the value length. A first size of the programmed KV pair data and the generated ECC parity is less than a second size of the KV pair data and the ECC parity generated without the determining. A third size is the second size minus the first size. The third size is used for additional overprovisioning. A third size is the second size minus the first size. The third size is used for data shaping or controller metadata. A third size is the second size minus the first size. The third size is used for content metadata.

In another embodiment, a data storage device includes a memory device and a controller coupled to the memory device. The controller is configured to determine an error correction code (ECC) code length for KV pair data and/or an ECC code rate for the KV pair data, where the ECC code length and the ECC code rate are selected according to a value length and a relative performance (RP) of the KV pair data, generate ECC parity based on the selecting, and program the KV pair data and the generated ECC parity to the memory device.

The KV pair data is received from a host device. The KV pair data includes the value length and the RP of the KV pair data. The programmed KV pair data and generated ECC parity is in a size less than the KV pair data and the ECC parity generated without the determining. Values of the KV pair data spans across one or more wordlines. The controller is further configured to read the values of the KV pair data sequentially. A first amount of the generated ECC parity is less than a second amount of generated ECC parity. The second amount of generated ECC parity is generated without the determining.

In another embodiment, a data storage device includes memory means and a controller coupled to the memory means. The controller is configured to select an error correction code (ECC) rate and/or an ECC length based on one or more of a value length, a relative performance (RP), and a decoding capability of a key value (KV) pair data.

A first value length is greater than a second value length. A first correction capability associated with the first value length is greater than a second correction capability associated with the second value length. The controller is further configured to store content metadata. The content metadata includes features of an image document and/or data of a text document.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, the controller configured to:
determine an error correction code (ECC) code length for key value (KV) pair data and/or an ECC code rate for the KV pair data, wherein the ECC code length and the ECC code rate are selected according to a value length of the KV pair data and a correction capability associated with the KV pair data, and wherein the correction capability is based on a detected pattern of the KV pair data;
generate ECC parity based on the selecting; and
program the KV pair data and the generated ECC parity to the memory device.

2. The data storage device of claim 1, wherein all KV pair data is associated with an equal correction capability.

3. The data storage device of claim 2, wherein the correction capability associated with the KV pair data is independent of the value length of the KV pair data.

4. The data storage device of claim 1, wherein the controller is further configured to select the ECC code rate based on a relative performance (RP) associated with the KV pair data and the value length, and wherein the RP indicates a location of the memory device to store the KV pair data based on a health metric of the location.

5. The data storage device of claim 4, wherein the RP comprises a first tier, a second tier, a third tier, and a fourth tier, wherein the first tier has a better performance than the second tier, wherein the second tier has a better performance than the third tier, and wherein the third tier has a better performance than the fourth tier.

6. The data storage device of claim 1, wherein the controller is further configured to receive KV pair data from a host device.

7. The data storage device of claim 6, wherein the received KV pair data includes the value length.

8. The data storage device of claim 1, wherein a first size of the programmed KV pair data and the generated ECC parity is less than a second size of the KV pair data and the ECC parity generated without the determining.

9. The data storage device of claim 8, wherein a third size is the second size minus the first size, and wherein the third size is used for additional overprovisioning.

10. The data storage device of claim 8, wherein a third size is the second size minus the first size, and wherein the third size is used for data shaping or controller metadata.

11. The data storage device of claim 8, wherein a third size is the second size minus the first size, and wherein the third size is used for content metadata.

12. A data storage device, comprising:
a memory device; and
a controller coupled to the memory device, the controller configured to:
determine an error correction code (ECC) code length for key value (KV) pair data and/or an ECC code rate for the KV pair data, wherein the ECC code length and the ECC code rate are selected according to a value length and a relative performance (RP) associated with the KV pair data, and wherein the RP indicates a location of the memory device to store the KV pair data based on a health metric of the location;
generate ECC parity based on the selecting; and
program the KV pair data and the generated ECC parity to the memory device.

13. The data storage device of claim 12, wherein the KV pair data is received from a host device, and wherein the KV pair data includes the value length and the RP of the KV pair data.

14. The data storage device of claim 12, wherein the programmed KV pair data and generated ECC parity is in a size less than the KV pair data and the ECC parity generated without the determining.

15. The data storage device of claim 12, wherein values of the KV pair data spans across one or more wordlines.

16. The data storage device of claim 15, wherein the controller is further configured to read the values of the KV pair data sequentially.

17. The data storage device of claim 12, wherein a first amount of the generated ECC parity is less than a second amount of generated ECC parity, and wherein the second amount of generated ECC parity is generated without the determining.

18. A data storage device, comprising:
memory means; and
a controller coupled to the memory means, the controller configured to:
select an error correction code (ECC) rate and/or an ECC length based on one or more of a value length, a relative performance (RP), and a correction capability associated with a key value (KV) pair data, wherein the correction capability is based on a detected pattern of the KV pair data, and wherein the RP indicates a location of the memory device to store the KV pair data based on a health metric of the location.

19. The data storage device of claim 18, wherein a first value length is greater than a second value length, and wherein a first correction capability associated with the first value length is greater than a second correction capability associated with the second value length.

20. The data storage device of claim 18, wherein the controller is further configured to store content metadata, and wherein the content metadata comprises features of an image document and/or data of a text document.

* * * * *